(12) United States Patent
Wintenberger et al.

(10) Patent No.: US 7,312,422 B2
(45) Date of Patent: Dec. 25, 2007

(54) SEMICONDUCTOR BATCH HEATING ASSEMBLY

(75) Inventors: Eric Wintenberger, Beachwood, OH (US); Douglas Alan Longworth, Brecksville, OH (US); Wei Fan, Middleburg Heights, OH (US); John Thomas Mariner, Avon Lake, OH (US)

(73) Assignee: Momentive Performance Materials Inc., Wilton, CT (US)

( * ) Notice: Subject to any disclaimer, the term of this patent is extended or adjusted under 35 U.S.C. 154(b) by 0 days.

(21) Appl. No.: 11/548,598

(22) Filed: Oct. 11, 2006

(65) Prior Publication Data

US 2007/0215596 A1   Sep. 20, 2007

Related U.S. Application Data

(60) Provisional application No. 60/788,861, filed on Mar. 17, 2006.

(51) Int. Cl.
*F27B 5/14* (2006.01)
*C23C 16/00* (2006.01)

(52) U.S. Cl. .............. 219/390; 219/405; 219/411; 219/406; 118/724; 118/725; 118/50.1; 392/416; 392/418

(58) Field of Classification Search ............... 219/390, 219/405–6, 411; 392/416, 418; 118/724, 118/725, 50.1
See application file for complete search history.

(56) References Cited

U.S. PATENT DOCUMENTS

| | | |
|---|---|---|
| 5,342,022 A | 8/1994 | Gilbert et al. |
| 5,668,524 A | 9/1997 | Aida et al. |
| 5,693,581 A | 12/1997 | Homma et al. |
| 5,777,543 A | 7/1998 | Aida et al. |
| 5,850,071 A | 12/1998 | Makiguchi et al. |
| 6,497,734 B1 | 12/2002 | Barber et al. |
| 6,765,178 B2 | 7/2004 | Shang et al. |
| 2004/0035847 A1 | 2/2004 | Gat |
| 2004/0074899 A1 | 4/2004 | Mariner et al. |
| 2004/0173161 A1 | 9/2004 | Mariner et al. |

*Primary Examiner*—Shawntina Fuqua
(74) *Attorney, Agent, or Firm*—Dominick G. Vicari

(57) ABSTRACT

A heat treatment apparatus for use in batch heating/wafer processing is provided, which comprises a process chamber for receiving a wafer boat, at least a heating element comprising a substrate body configured to form an electrical heating circuit for at least one heating zone and encapsulated in a continuous overcoat layer, a heat reflector comprising a heat reflective surface disposed on the heating element, and the heating element has a ramp rate of at least 1° C. per second for heating the wafers in the wafer boat.

20 Claims, 4 Drawing Sheets

SEMICONDUCTOR BATCH HEATING ASSEMBLY

CROSS-REFERENCE TO RELATED APPLICATIONS

This application claims the benefits of U.S. 60/788,861 filed Mar. 17, 2006 which patent application is fully incorporated herein by reference.

FIELD OF INVENTION

The present invention relates to a heating device primarily for use in semiconductor wafer processing equipment.

BACKGROUND OF THE INVENTION

High temperature processing of silicon wafers is important for manufacturing modern microelectronics devices. Such processes, including silicide formation, implant anneals, oxidation, diffusion drive-in and chemical vapor deposition (CVD), may be performed at temperatures ranging from about 300° C. to 1200° C. in either multi-wafer batch furnaces or in single-wafer rapid thermal processors. These steps typically require a very accurate control of the temperature, pressure, and flow of gases in the chamber. In one embodiment of the prior art, the processing steps are done in a tube furnace, where wafers are processed in batch mode for increased throughput.

In conventional batch furnaces of the prior art, electrical heating elements are typically used. Electrical heating elements such as metal coil elements are usually insulated with a ceramic material, e.g., sintered alumina or aluminum nitride, inherently susceptible to mechanisms generating cracks and particles when undergoing thermal cycling. The thermal mass of such systems is high and results in low heating and cooling rates. Moreover, due to the discontinuous surface of conventional coil elements, the power density varies dramatically across the area to be heated. Additionally, because of the differential thermal expansion between the metal heating elements and the ceramic insulation during thermal cycling, the use of heaters in the prior art can result in particle generation or failure. During processing procedures while power is applied, the particles do not generally cause processing problems, as they are typically suspended above the semiconductor substrate. However, as the power is reduced at the end of a processing cycle, the forces that suspend the particles dissipate allowing them to fall and land upon the semiconductor substrate surface causing contamination. The falling action can be the result of both gravity and electrostatic attraction to the semiconductor substrate. Besides the particle contamination problem with conventional batch furnaces employing heaters comprising sintered ceramic materials, there is also a reliability issue and inherent limitations in terms of heating and cooling rates. Sintered ceramics are susceptible to thermal shock and tend to break when undergoing high temperature gradients.

In order to reduce the problems of unwanted dopant diffusion or particles from heaters landing on the semiconductor substrate surface causing contamination, high intensity lamps are used in some conventional semiconductor batch processing chambers. Radiant lamps allow very fast heating because of their extremely low thermal mass and rapid cooling because they can be turned off instantly. However, problems may be encountered with the use of high intensity lamps because they are localized energy sources. Not only do temperature differences arise during heating and cooling transients, as in traditional batch furnaces, but non-uniformities may also persist during processing. The interior walls of typical lamp based RTP systems are usually relatively cool and are not heated to a uniform equilibrium process temperature as in a conventional batch furnace. For larger diameter wafers, it may be difficult to maintain a uniform temperature across a wafer. For other systems, they fail to provide uniform wafer-to-wafer heating to a boat of multiple wafers. Many lamps use a linear filament, which makes them ineffective at providing uniform heat to a round wafer. It may be necessary to dynamically detect temperature non-uniformities and actively adjust heating during processing. This, in turn, may require complex temperature measurement systems. Additional problems may be encountered in some lamp based systems due to aging and degradation of lamps and other components. As a result, it may be difficult to maintain repeatable performance and frequent replacement of parts may be necessary.

Besides the contamination and uniformity issues, there is a conformity limitation in batch systems of the prior art. Batch systems for semiconductor wafer processing often have a cylindrical geometry, which is driven by the round shape of the wafers. The geometry of the heating system often tries to conform to the geometry of the substrates. In the resistive heaters of the prior art, metal coil elements embedded in ceramic insulation do not provide a continuous heating surface. Systems employing arrays of lamps typically cannot provide a cylindrical heating surface.

The invention relates to a semiconductor processing system which can provide fast, uniform, energy-efficient, and contaminant-free heating and cooling to a plurality of wafers, while allowing the design flexibility desirable in batch processing apparatuses.

SUMMARY OF THE INVENTION

In one embodiment, the invention relates to a batch treatment apparatus comprising a chamber having an interior for placement of a wafer boat for processing a plurality of wafers; at least a radiant heater located outside and conforming to the exterior of the chamber for heating the plurality of wafers contained therein at a heater ramp rate of at least 40° C./min in a range of 300-800° C., the heater having at least one resistance heating element patterned in a plurality of circuits defining at least one zone for independent controlled heating of said at least zone, at least a portion of the surface of the resistance heating element is coated with a dielectric insulating layer comprising at least one of a nitride, carbide, carbonitride or oxynitride of elements selected from a group consisting of B, Al, Si, Ga, refractory hard metals, transition metals, and rare earth metals, or complexes and/or combinations thereof, at least one heat shield disposed on an exterior side of the heater opposite the heater side facing the chamber containing the wafer boat and an insulating enclosure disposed outside the heat shield.

In one aspect, the radiant heater comprises a graphite core having an encapsulant forms a substantially continuous surface coating the graphite core, with the encapsulant being a thin shell of a material selected from a nitride, carbide, carbonitride or oxynitride of elements selected from a group consisting of B, Al, Si, Ga, refractory hard metals, transition metals, and rare earth metals, or complexes and/or combinations thereof; a high thermal stability zirconium phosphates having an NZP structure of $NaZr_2(PO_4)_3$; a glass-ceramic composition containing at least one element selected from the group consisting of elements of the group 2a, group 3a and group 4a of the periodic table of element;

a mixture of $SiO_2$ and a plasma-resistant material comprising an oxide of Y, Sc, La, Ce, Gd, Eu, Dy, or the like.

The invention in one aspect, relates to a method for heating a plurality of wafers in a batch treatment apparatus employing the heater having at least one resistance heating element patterned in a plurality of circuits defining at least one zone for independent controlled heating of said at least zone, at least a portion of the surface of the resistance heating element is coated with a dielectric insulating layer comprising at least one of a nitride, carbide, carbonitride or oxynitride of elements selected from a group consisting of B, Al, Si, Ga, refractory hard metals, transition metals, and rare earth metals, or complexes and/or combinations thereof, for heating the wafer substrates to a temperature of up to 800° C. at a heater ramp rate of at least 40° C./min in a range of 300-800° C.

DETAILED DESCRIPTION OF THE INVENTION

As used herein, approximating language may be applied to modify any quantitative representation that may vary without resulting in a change in the basic function to which it is related. Accordingly, a value modified by a term or terms, such as "about" and "substantially," may not to be limited to the precise value specified, in some cases.

The term "resistive heater" may be used interchangeably with "heater" or "heating element" and that the term may be in the singular or plural form, indicating one or multiple items may be present. As used herein, "heat shields" are used interchangeably with "heat reflectors" or "radiation baffles."

"Wafer substrates" or "substrates" as used herein are in the plural form, but the terms are used to indicate one or multiple substrates can be used, and that "wafer" may be used interchangeably with "substrate." Likewise, "heating plates," "heating elements," "coating layers," "reflecting elements" or "reflectors" may be used the plural form, but the terms are used to indicate that one or multiple items may be used.

"Batch processing chamber" may be used interchangeably with "batch heating assembly," or "batch furnace," referring to an assembly with an enclosed chamber under vacuum, having a plurality of substrates (wafer) contained within, with the enclosed chamber being heated by one or more heaters to a temperature of 300-800° C.

The invention relates to a semiconductor batch processing chamber, wherein resistive heaters comprising an encapsulated solid body are used. The batch heating system of the invention allows fast, uniform and relatively contaminant-free thermal processing of multiple wafers, based on the low thermal mass and purity of ceramic-encapsulated graphite heaters. The assembly includes one or a plurality of ceramic heaters arranged to uniformly heat a boat of wafers contained within an enclosed chamber, and wherein the ceramic heaters are surrounded by low-thermal mass insulation such as heat shields.

Figure 1:
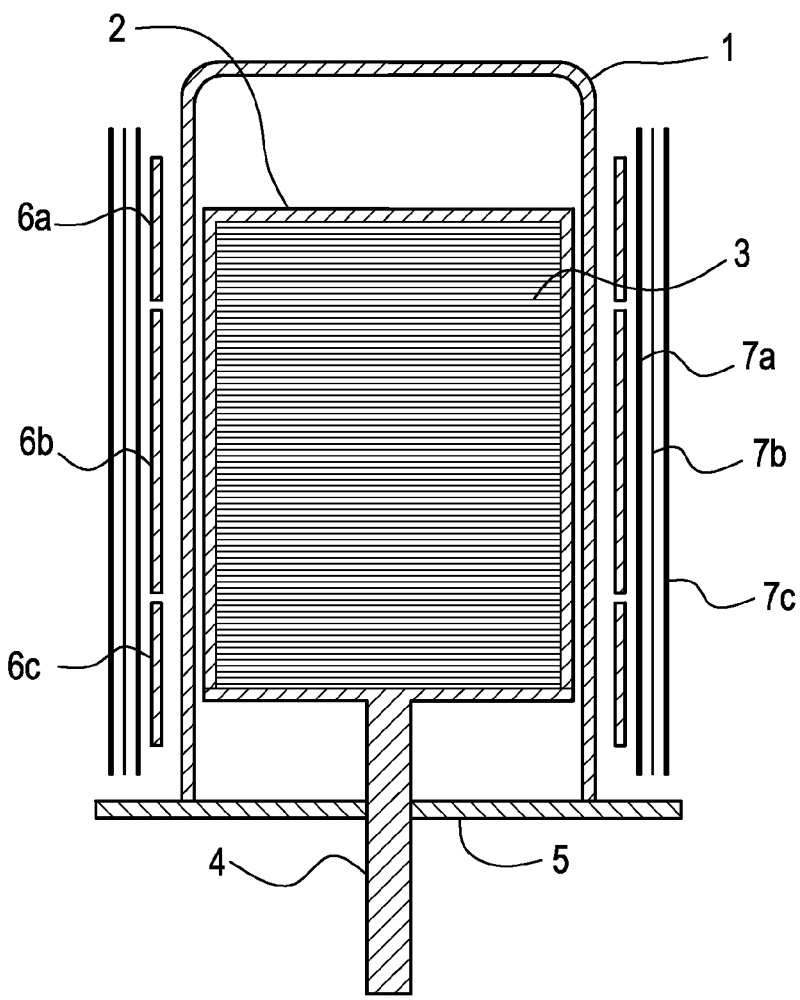
FIG. 1 is a cross-sectional view of an embodiment of the semiconductor batch processing chamber of the invention, which shows a structure thereof.

Batch Processing Chamber: FIG. 1 illustrates one embodiment of a batch furnace of the invention, for a vertical heat treatment apparatus. The batch furnace comprises an enclosed chamber 1 which maintains the environment conditions (pressure level, gas flow levels etc.) necessary to the process. In one embodiment, the chamber 1 is made of high-purity quartz material to reduce contamination of the wafers 3. In one embodiment (not shown), the process chamber 1 is in the form of a tube or double structure type with an inner pipe and an outer pipe. A plurality of wafers 3 is loaded into the wafer boat 2, having a plurality of supports or shelves, for the placement of the wafers during processing. In one embodiment, the wafer boat 2 is supported by a shaft 4 extending through a base plate 5. The shaft 4 can move the wafer boat in and out of the process chamber 1 for loading/unloading of the wafers 3. The shaft 4 typically rotates around its axis to average out any process non-uniformity on the wafers 3. For processes involving flow of gases, gas inlet and exhaust ports can be located in the base plate 5 or in the process chamber wall 1.

Before the actual process can start, the wafers have to be loaded onto the wafer boat. Similarly, at the end of the process, the wafers have to be unloaded from the boat and new wafers have to be loaded. Loading/unloading wafers is typically carried out at temperatures much lower than the process temperature. Thus, once the wafers are loaded onto the wafer boat, it is necessary to heat up the furnace from the loading/unloading temperature to the process temperature. The need to wait for conditions in the furnace to reach steady state for uniform results requires long processing times. Similarly, it is necessary to cool down the furnace before the wafers can be unloaded at the end of the process. The time required to heat up and cool down the furnace can represent a significant portion of the overall cycle time and has to be minimized for increased throughput. The energy input into the wafer in the overall time-temperature cycle is often referred to as the thermal budget. The long processing times required can violate limitations imposed by the thermal budget of the process recipe.

In one embodiment of batch heating assembly, wafers 3 are heated to the process temperature by resistive heating elements 6a-6c. These resistive heating elements are ceramic-encapsulated graphite heaters, housed in a low-thermal mass insulation whose role is to reduce heat loss to the environment and optimize the efficiency of the system. The ceramic-encapsulated graphite heaters 6a-6c are disposed around the quartz chamber 1 housing the wafer boat 2 containing the wafers 3 to be processed.

In one embodiment to achieve better temperature uniformity on the wafers 3, multiple heaters are used to create several heating zones 6a-6c, whose power density can be independently controlled. Each heating zone can consist of one or multiple heaters. Large-size heating zones can be created by mounting several heaters together in series or in parallel and using a single temperature controller to power those heaters.

Heat shields 7a-7c are disposed around and adjacent to the heaters to reduce heat losses. In one embodiment, the shields are in direct contact with the heater. In another embodiment, there is a gap of 5 to 20 mm between the shields and the heaters. The heat shields effectively increase the heating rate and reduces the thermal budget of the process, as they reflect the heat radiated by the ceramic heaters to minimize the heat transferred to the outside of the chamber. As shown in FIG. 1, heat shields are located on the outside of the heaters. In other embodiments, heat shields can be positioned above or below the quartz chamber to reduce the heat losses through the top or bottom of the wafer boat and help maintain good temperature uniformity across the batch of wafers.

In one embodiment, the heat shields comprise highly reflective metals, such as aluminum, stainless steel, molybdenum, tantalum etc. In a second embodiment, the heat shields are made with any material which reflects heat, including ceramic materials such as pyrolytic boron nitride, aluminum nitride etc. In one embodiment, the surface of the heat shields is polished to increase their reflectivity. The higher the reflectivity, the more heat will be reflected onto the heater and the more thermally efficient the system will be. In one embodiment, the heat shields comprise a thin metal foil or layer with a thickness of 0.001" to 0.05". Because they are so thin, heat shields inherently have a very low thermal mass, which makes them ideal for applications where fast heating and cooling is advantageous.

In one embodiment, the heat shields 7a-7c further comprises insulators such as metal plated ceramics, metalized glass, and the like that are process resistant and generally free of contaminates such as copper.

Fast Ramp Rate Resistive Heaters for Reduced Particle Contamination: In one embodiment of a batch heating assembly having reduced particle contamination, e.g., contamination-free or almost contamination-free, the resistive heater 6a-6c comprises a substrate body with a heating surface configured in a pattern for an electrical flow path defining at least one zone of an electrical heating circuit, and with a dielectric insulating coating layer encapsulating a patterned body as the substrate.

In one embodiment, the substrate body of the heating elements 6a-6c comprises graphite. In another embodiment, the substrate body comprises a material selected from one of quartz, boron nitride, sintered aluminum nitride, sintered silicon nitride, sintered body of boron nitride and aluminum nitride, and a refractory metal selected from the group of molybdenum, tungsten, tantalum, rhenium, and niobium. The surface of the heating elements 6a-6c of the invention is substantially continuous and coated with overcoat layer or layers for hermetically sealing the patterned heat-generating resistor body, other than those surfaces necessary for electrical connections, thereby preventing short circuits and electrical changes from occurring, and insuring a substantially continuous surface free from graphite dust and particles.

In one embodiment, the coating layer is comprised of at least one of a nitride, carbide, carbonitride or oxynitride of elements selected from a group consisting of B, Al, Si, Ga, refractory hard metals, transition metals, and rare earth metals, or complexes and/or combinations thereof.

In one embodiment, the coating layer of the resistive heating elements 6a-6c comprises a high thermal stability zirconium phosphates, having the NZP structure of $NaZr_2(PO_4)_3$, as well as to related isostructural phosphates and silicophosphates having a similar crystal structure. In another embodiment, the protective coating layer 25 contains a glass-ceramic composition containing at least one element selected from the group consisting of elements of the group 2a, group 3a and group 4a of the periodic table of element. The group 2a as referred to herein means an alkaline earth metal element including Be, Mg, Ca, Sr and Ba. The group 3a as referred to herein means Sc, Y or a lanthanoid element. The group 4a as referred to herein means Ti, Zr or Hf Examples of suitable glass-ceramic compositions for use as the coating layer 25 include but are not limited to lanthanum aluminosilicate (LAS), magnesium aluminosilicate (MAS), calcium aluminosilicate (CAS), and yttrium aluminosilicate (YAS). In one example, the protective coating layer 25 contains a mixture of $SiO_2$ and a plasma-resistant material comprising an oxide of Y, Sc, La, Ce, Gd, Eu, Dy, or the like, or a fluoride of one of these metals, or yttrium-aluminum-garnet (YAG). Combinations of the oxides of such metals, and/or combinations of the metal oxides with aluminum oxide, may be used. In another embodiment, the protective coating layer 25 is based on $Y_2O_3$—$Al_2O_3$—$SiO_2$ (YAS), with the yttria content varying from 25 to 55 wt. % for a melting point of less than 1600° C. and a glass transition temperature (Tg) in a narrow range of 884 to 895° C. In one embodiment of resistive heaters with multiple coating layers, the outer coat may be of the same material, or of a different material from the first coating layer.

In one embodiment of resistive heaters 6a-6c with a graphite core, the electrical pattern as defined by the graphite body may be of various sizes and shapes for defining an electrical flow path for at least one zone of an electrical heating circuit, e.g., a spiral or serpentine, a spirally coil, a zigzag, a labyrinthine pattern, etc. The thickness of the graphite body may be determined from electrical calculations known in the art, i.e., based on the length, the width, and the thickness of the serpentine electrical path, with the thickness of the electrical path being designed in to the graphite base 10. In one embodiment, the graphite base 10 has a thickness of at least 0.05 inches. In a second embodiment, at least about 0.10 inches. In one embodiment, electrical contacts are machined through the coating layer(s) to expose the graphite at contact locations for connection to an external power source. Alternatively, electrical contact extensions can be machined into the graphite base at the outset before the final coating process, or added prior to the over coating operation.

In one embodiment of resistive heaters 6a-6c, the coating material is one of pyrolytic boron nitride, aluminum nitride, titanium aluminum nitride, titanium nitride, titanium aluminum carbonitride, titanium carbide, silicon carbide, and silicon nitride, in undoped form or doped form with materials such as carbon, silicon, or $Y_2O_3$. Both pBN and AlN have excellent insulating and conducting properties and can be easily deposited from the gaseous phase. They also have a high temperature stability. Additionally, they have a different color (white) than the pyrolytic graphite base (black), thus in the step of forming the electrical patterns, the coating layer can be easily visually distinguished from the patterns.

Different methods can be used to deposit the coating layer or layers onto the body/substrate of the resistive heaters, including expanding thermal plasma (ETP), ion plating, plasma enhanced chemical vapor deposition (PECVD), metal organic chemical vapor deposition (MOCVD) (also called Organometallic Chemical Vapor Deposition (OM-CVD)), metal organic vapor phase epitaxy (MOVPE), physical vapor deposition processes such as sputtering, reactive electron beam (e-beam) deposition, painting then heating (for a relatively thick coating layer), thermal spray, and plasma spray. The methods can be combined for a plurality of coating layers on the substrate of the heater, with each layer being deposited by a different method. In one embodiment, the coating layer has a thickness of 0.005 to 0.10 inches. In a second embodiment, this coating layer is about 0.01 to 0.05 inches. In a third embodiment, the coating layer has a thickness of less than about 0.02 inches. In yet a fourth embodiment, the coating layer is a substantially continuous surface layer having a thickness in the range of about 0.01-0.03 inches.

In one example of a heating element as described in U.S. Pat. No. 5,343,022, the heating element comprises a pyrolytic boron nitride (pBN) plate as the substrate having a patterned pyrolytic graphite layer disposed thereon forming a heating element, and at least a coating layer encapsulating the patterned plate. In another example of a heating element as described in US Patent Publication US20040074899A1, the heating element comprises a graphite body configured in a pattern for an electrical flow path for a resistive heater, encapsulated in at least a coating layer comprising one of a nitride, carbide, carbonitride or oxynitride compound or mixtures thereof. In yet another example of a heating element as disclosed in US Patent Publication No. US20040173161A1, the heating element comprises a graphite substrate, a first coating containing at least one of a nitride, carbide, carbonitride or oxynitride compound, a second coating layer of graphite patterned forming an electrical flow path for a resistive heater, and a surface coating layer on the patterned substrate, the surface coating layer also containing at least one of a nitride, carbide, carbonitride or oxynitride compound. In one embodiment wherein pBN is used for the overcoat layer, the layer thickness is optimized to promote thermal uniformity, taking into advantage the high degree of thermal conductivity anisotropy inherent in pBN. In a second embodiment, multiple overcoat layers are employed to promote thermal uniformity.

Radiant heaters for use in the batch assembly are characterized as having an excellent ramp rate, i.e., >40° C. per minute between 100 and 300° C. In one embodiment for a temperature range between 100 and 300° C., the heaters have a ramp rate of >60° C./minute, in another embodiment, a ramp rate of >80° C. per second. In yet another embodiment, the ramp rate is >100° C. per minute. In a fifth embodiment, the ramp rate is >150° C. per minute. Other heaters with excellent resistance to thermal shock under extreme conditions and fast thermal response rates, e.g., with heating rates >5° C. per second for a 100-300° C. temperature range, can also be used.

The heater may be of a cylindrical shape, a flat disk, a platen, and the like with dimensions suitable for use in the batch heating apparatus. In one embodiment, each heater is 2 to 20 inches in its longest dimension (e.g., diameter, length, etc.) and 0.05" to 0.50" inches thick. In one embodiment, it may be of a disk having a dimension of 2" long×2" wide×0.01" mm thick. In a third embodiment of a cylinder (or partial sections, forming a cylinder), the cylindrical heater has dimensions of 2" to 20" in inside diameter, 0.10" to 0.50" wall, and 2" to 40" long.

Figure 2A:
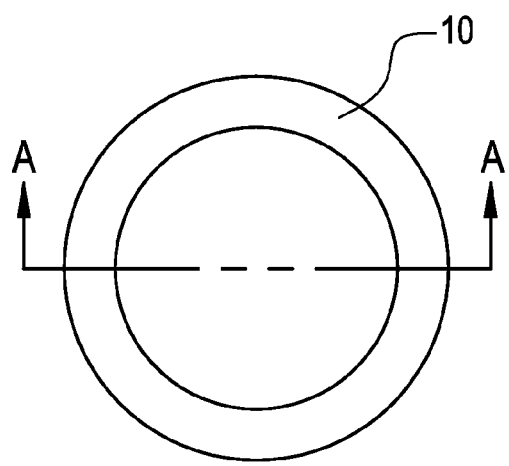
FIG. 2(a) is a top view.
Figure 2B:
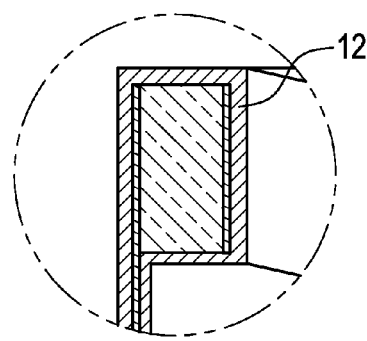
FIGS. 2(b) and 2(c) are cross-section views of one embodiment of the resistive heaters used in the processing chamber of FIG. 1.
Figure 2C:
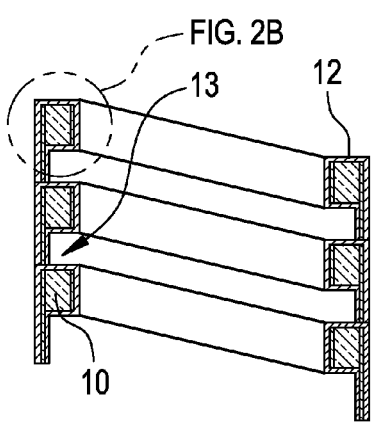

FIG. 2A represents a top view of one embodiment of heaters 6a-6c, having a cylindrical shape. FIG. 2B shows the cylindrical heater in cross section taken along the lines A-A of FIG. 2A, and FIG. 2C represents an exploded view of the encircled area shown in FIG. 2B. The graphite body or base 10 can be of any desired thickness suitable for semiconductor processing applications. The outer coating layer 12 encapsulates both surfaces of the graphite base body 10. In another embodiment, the coating layer 12 simply covers the top surface of the graphite base body 10 for corrosion resistance and structural support. The pattern 13 is that of a spiral or serpentine configuration, with open ends adapted for connection to an external power supply (not shown).

Figure 3:
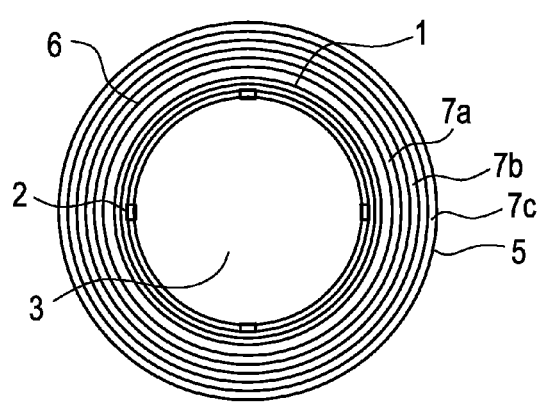
FIG. 3 is a top cross-section of one embodiment of a cylindrical embodiment of the batch heating system of the invention.
Figure 4:
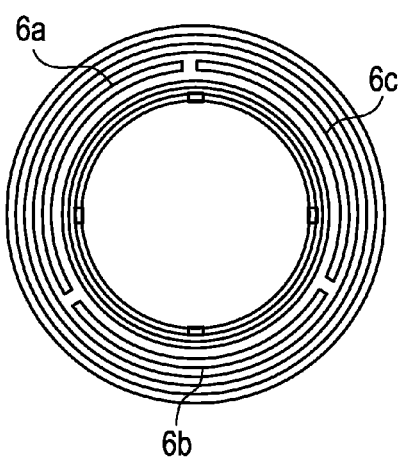
FIG. 4 is a top cross-section of a second embodiment of a cylindrical section embodiment of the batch heating system of the invention.

Different Embodiments of Batch Heating Assemblies: In one embodiment, the batch heating system conforms to the geometry of round wafers to provide a continuous cylindrical heating surface around the quartz chamber. FIG. 3 is a top cross-section view of a cylindrical embodiment of heaters 6a-6c. In another embodiment as the quartz chamber cannot be completely surrounded by the heaters and openings have to be allowed at some radial locations, the heaters comprise cylindrical sections of heating elements surrounded by heat shields (see FIG. 4). The cylindrical sections are spaced apart to allow for access to the quartz chamber for process or measurement purposes, and they are easier to fabricate from a manufacturing standpoint. Furthermore, the sections provide design flexibility to accommodate a process with radial non-uniformities caused by geometry, gas flow, or any other non-axisymmetric disturbances.

Figure 5:
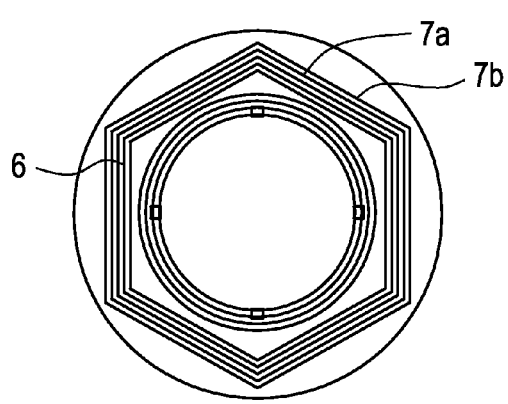
FIG. 5 is a top cross-section of a hexagonal embodiment of the batch heating system of the invention.
Figure 6:
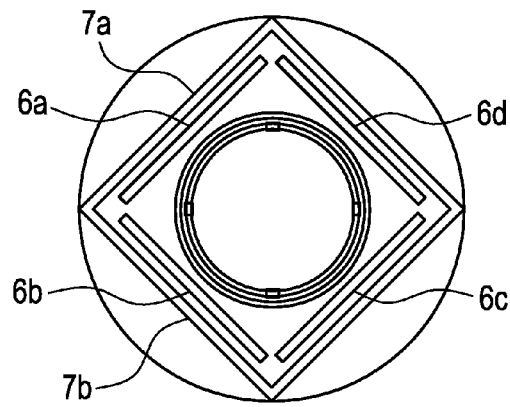
FIG. 6 is a top cross-section of a square embodiment of the batch heating system using plate heating elements.

In embodiments to accommodate wafer geometries encountered in semiconductor processing include square, rectangular, or more generally polygonal shapes, e.g. for flat panel display processing, the heaters 6a-6c have a polygonal geometry as illustrated in FIG. 5. In yet another embodiment, the heating system consists of plate heating elements disposed around the quartz chamber, as illustrated in FIG. 6. Plate heating elements are typically easier to manufacture and can be adapted to virtually any wafer geometry. They can also provide additional flexibility with radial temperature control.

In one embodiment, the heat shields comprises one single continuous piece as illustrated in FIG. 6. The heat shields may be attached using several methods such as bonding using pressure sensitive adhesives, ceramic bonding, glue, and the like, or by fasteners such as screws, bolts, clips, and the like that are process resistant and generally free of contaminates such as copper. In one embodiment, the heat shields consist of separate pieces fastened around the plate heaters. In a second embodiment, the heat shields are flat plates fastened to the backside of the plate heaters for easy installation and removal. In yet another embodiment, the heat shields are spaced from the heaters 6a-6c using insulated fasteners such as insulated screws, bolts, clips, and the like, forming a gap there between.

Electrical contact to the heaters can be made in a variety of ways. In one embodiment of plate or polygonal type heaters, the coating layer removed to expose the graphite at a given location, then to bolt a conductive rod onto the exposed graphite using threaded nuts and graphite washers for improved contact. The rods and nuts can be made of any conductive material such as aluminum, stainless steel, molybdenum, tantalum etc. In applications where exposed graphite is not allowed, or where protrusions inside of the inner surface defined by the heaters are undesirable, electrical connections can be made via the use of ceramic-coated graphite posts.

In one embodiment, the graphite posts are either fastened to graphite screws, or directly threaded into the graphite base of the heating element. These techniques allow the electrical connection to be located further away from the heated surfaces, e.g., on the outside of the heat shields where the temperature is much lower. As the electrical connections are located in a lower temperature region, they are less subject to differential thermal expansion thus facilitating flexible designs.

Figure 7:
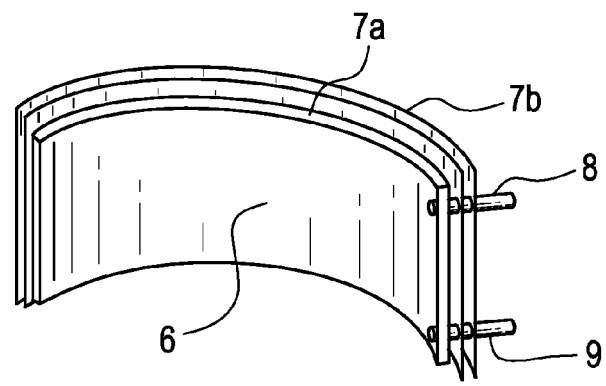
FIG. 7 is a sectional view of a cylindrical section embodiment of the invention using external posts for electrical connection.

In one embodiment of a batch system employing external posts for electrical connection as illustrated in FIG. 7, sectional cylindrical heater 6 is provided with a plurality of heat shields 7a-7b located on the outside. Power is fed into the heater via PBN-coated graphite posts 8 and 9. These posts go through the heat shields to make contact on the outside of the heating system, where the electrical connections will be at a much lower temperature. In one such embodiment, the heater core temperature is measured at 700° C. while the post end temperature is measured at a much lower 500° C. Other methods can also be used to connect the graphite posts to power cables, including, but not restricted to, metal rods threaded into the graphite posts, clamps on the outside diameter of the posts, tongue terminals screwed flat against the post ends etc.

Characteristics of the Batch Heating Assemblies: In one embodiment of the heating assembly, the heaters 6a-6c comprise graphite as heating elements for a low resistance, thus requiring the use of a low-voltage, high-current power supply. The final resistance of the ceramic-encapsulated graphite heater can be tightly controlled during manufacturing. In one embodiment, the heater has less than 0.5% part-to-part variation is typical, and in a second embodiment, less than 0.1%. For example, two cylindrical section heaters 6a-6c, with an 8" inner diameter, 130-degree radial extension, and 6.3" height, are manufactured with the same conductor pattern. The first part has a final resistance of 6.655 ohms, whereas the second part has a final resistance of 6.639 ohms, within 0.24% of that of the first part. Therefore in one embodiment, several of the heaters are mounted in series and used as one independent heating zone. The advantage of mounting them in series is that the overall heating zone resistance is increased. By selecting the right amount of heaters to mount in series, a conventional high-current, low-voltage power supply (e.g. 200 V, 20 A) can be used to power the heaters.

The combination of the excellent thermal shock resistance property of the ceramic-encapsulated heaters and the low thermal mass of the heat shield insulation, allows very high ramp rates to be obtained with the present invention. In one embodiment wherein pBN encapsulated graphite heater(s) are used, the batch heating assembly is heated at ramp rates in excess of 600° C./min without adverse effect observed on the heater(s). Furthermore with the use of the heat shields and with metalized insulation layers reflecting the heat emitted by the heater onto itself, a higher ramp rate is obtained. The heat shields themselves inherently get heated very quickly because of their low thermal mass.

In one embodiment of the batch heating assembly with the use of the encapsulated heaters 6a-6c with a very fast thermal response, the wafers can be heated very quickly to bring the wafers to a process temperature on the order of 300-1000° C. at a rate of 1° C./sec. In one embodiment of the invention, the heaters are heated from room temperature to 1000° C. at a rate of at least 10° C. per minute ("ramp rate"). In a second embodiment, the ramp rate is at least 40° C./min. In a third embodiment, the rate is between 60-300° C./min.

In one embodiment, the batch heating assembly is further characterized as having a total thermal mass of less than 1/10 the thermal mass of a batch heating assembly in the prior art. This means that, for the same power supply, the batch heating assembly of the invention will heat up more than 10 times as fast as the batch heating assembly of the prior art. Graphite has a lower density than other ceramic materials, is extremely thermal shock-resistant, and can be machined very thin to make ceramic-encapsulated heaters. The heat shields can be made with sheet metal of thickness 0.001" to 0.05" typically, which results in very low mass components.

The thermal mass calculations can be illustrated as follows. For a 1 meter-tall cylindrical heating system with an inner diameter of 400 mm (typical for 300 mm wafer processing), a conventional ceramic heating system made with alumina, 40 mm thick, will have a total thermal mass at 25° C. of 184 kJ/K. In comparison, an embodiment of a batch heating assembly of the invention comprising a very-thin (8 mm) cylindrical ceramic-encapsulated graphite heater surrounded by two stainless steel heat shields spaced 10 mm on the outside of the heater, the thermal mass of the heater is 14.5 kJ/K and the thermal mass of the reflectors is about 1.3 kJ/K each. The total thermal mass is 17.1 kJ/K. This low thermal mass comes from the combination of the low thermal mass of the ceramic-encapsulated graphite heater and the low thermal mass of the heat shields.

The batch heating assembly employing encapsulated heaters is further characterized by excellent temperature uniformity on the inner surface of the heaters, as power density distribution can be tailored for uniformity by manufacturing the graphite pattern accordingly. Additionally, the continuous surface formed by the ceramic coating on the heating element generates a very high degree of thermal uniformity. In one embodiment wherein pBN or AlN coatings are used, the high thermal conductivity of the ceramic coating, e.g., 60 W/mK for pBN or 200 W/mK for AlN, helps spread out the heat more uniformly than in batch furnaces of the prior art, employing lower-conductivity materials like alumina. In one embodiment wherein heaters having section cylindrical geometry are employed (with an 8" ID), the thermal uniformity as defined by the difference between the maximum and the minimum temperature, is measured to be 5° C. in a center zone located 6" away from the edges of the heaters. The excellent thermal uniformity of the heater surface reflects in a corresponding thermal uniformity in the chamber wherein the wafers are contained, and subsequently, the wafers being heated. In one embodiment, the temperature difference between the maximum and minimum temperatures on the exterior surface of the wafer-containing chamber is less than 10° C.

In batch heating assemblies of the prior art and unless the heating elements are located close to each other or properly designed thermal insulation is used, edge effects worsen the thermal uniformity in the areas closer to the edges of the heating element, thus impacting the quality of the wafers to be heated.

Another advantage of the batch heating assembly employing encapsulated heaters is in reduced particle formation/deposited onto the semiconductor wafer. In typical batch assemblies, the wafer processing occurs inside of the quartz chamber, but particle generation and cleanliness of the heating system surrounding the quartz chamber is a key factor affecting the wafer surface. In spite of the many precautions taken to prevent contamination of the process environment inside the quartz chamber by gases and particles surrounding it (seal, positive pressure differential etc), particles can still find their way into the quartz chamber and contaminate the process. Thus, having a contaminant-free heating system is critical. In one embodiment of the invention, the batch heating assembly employs heaters coated with protective layers deposited via processes such as chemical vapor deposition. The coating layer is therefore pure, fully dense, and thermal-shock resistant. For example, pyrolytic boron nitride (pBN) has been cycled at heating rates in excess of 3000° C./min without evidence of particle generation, cracking or failure. Due to their manufacturing process, heaters employing these layers are not prone to the mechanisms generating cracks and particles in sintered materials. They are therefore more suitable to applications involving thermal cycling.

The batch heating assembly is further characterized as having extended/longer life in operation compared to the batch assemblies of the prior art. Heaters employing coatings such as AlN and/or pBN have demonstrated high oxidation resistance and excellent gas hermeticity. The heating components, graphite in this example, will be well protected by the pBN coatings. The batch apparatus can be used in wafer processes not rated for conventional metal coil heaters because of inherent oxidation problems, and with significantly lower hermeticity requirement on the process tools and purity of purging gases.

The invention is further illustrated by the following non-limiting examples.

EXAMPLE 1

An experiment was carried out to illustrate the ramp rate capability of a batch assembly employing ceramic-encapsulated heaters in the form of 200 mm inner diameter, 8 mm thick cylindrical sections of Boralectric® heater from General Electric Company ("GE"), having a graphite core and a pyrolytic boron nitride coating. The alumina spacers. The radiation baffle/encapsulated heater assembly was affixed to a support structure, then used to directly heat a quartz cylinder from 100° C. to 700° C. It should be noted that the heater had to be heated up quickly to 700° C., before stabilizing its temperature at 700° C.

Figure 8:
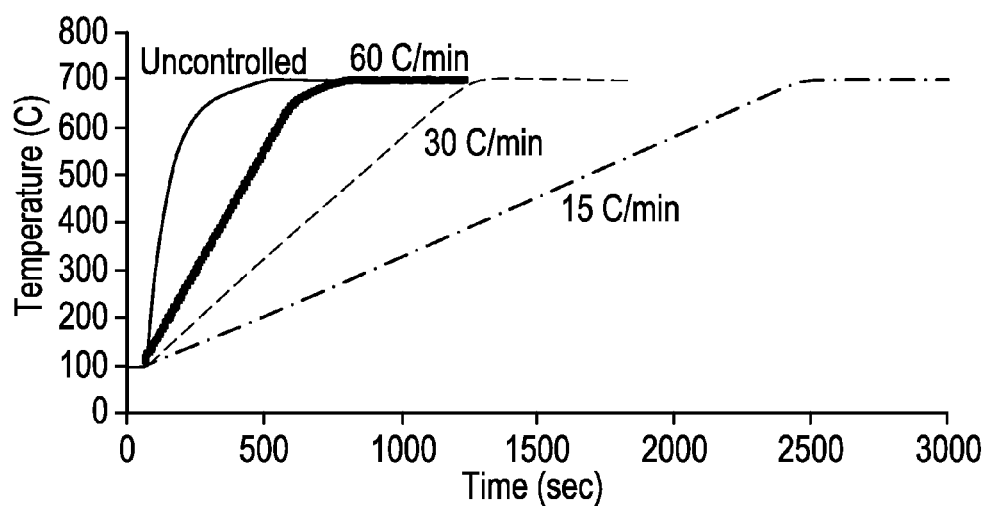
FIG. 8 is a graph illustrating the ramp rate of a section cylindrical embodiment of the invention.

FIG. 8 is a graph illustrating the different scenarios where the ramp rate of the heater was controlled at different values. In the experiments, the heater temperature increased at rates of 15, 30, and 60° C./min. Also in the experiments, the heater ramp rate was not controlled but full power was input into the heater (power increased as R dropped and I increased]. The ramp rate between 100 and 300° C. was 300° C./min. Between 300 and 600° C., it was measured to be 120° C./min. Between 600 and 700° C., it decreased to 42° C./min before the temperature was held constant at 700° C. It took less than 9 min for the heater to achieve constant temperature at 700° C. This was achieved with a power density of 8.5 W/cm² on the inner heater face. In comparison, the maximum heating rate achievable by sintered ceramic materials in the batch heating assembly of the prior art is on the order of 20° C./min, which significantly increases the processing times.

EXAMPLE 2

Figure 9:
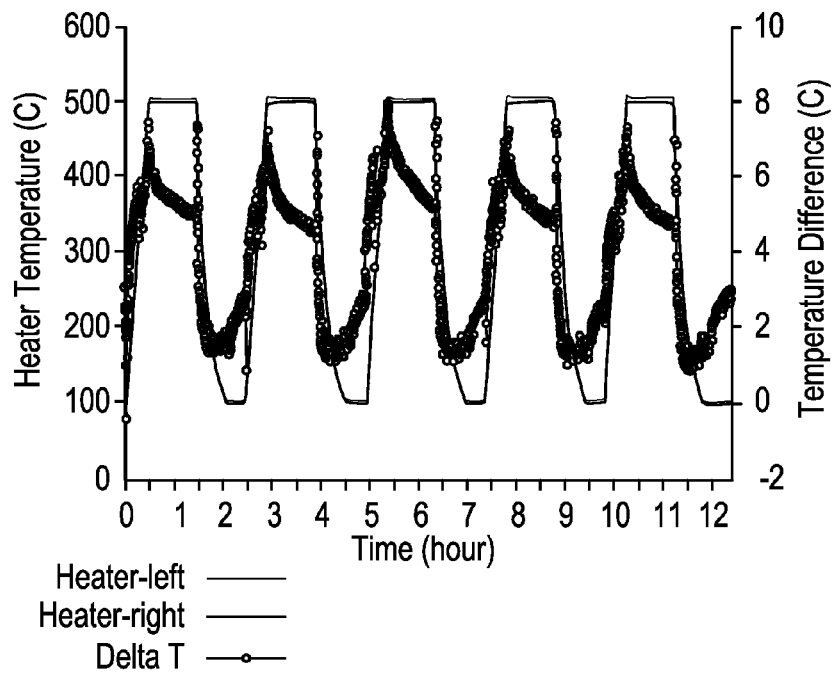
FIG. 9 is a graph illustrating the repeatability of a two-section cylindrical embodiment of the invention.

FIG. 9 is a graph illustrating accelerated life testing of another embodiment of a batch assembly employing 8 mm thick ceramic-encapsulated heaters spaced 10 mm apart from stainless steel reflectors used as the radiation baffle. In this experiment, two half-cylindrical sections mounted in series were tested. The sectional heaters (with each cylindrical half is as illustrated in FIG. 7) are from General Electric Company, as Boralectric® heaters having a graphite core and a pyrolytic boron nitride coating.

The assembly was cycled more than 100 times between 200 and 500° C. at a ramp rate of 45° C./min. The results show that this system is very repeatable, with excellent thermal uniformity. A temperature variation of less than 6.5° C. was obtained between the left heater and the right heater. This is due to the tight control on the heater resistance in the graphite heater employed in the batch heating assembly of the invention.

EXAMPLE 3

Figure 10:
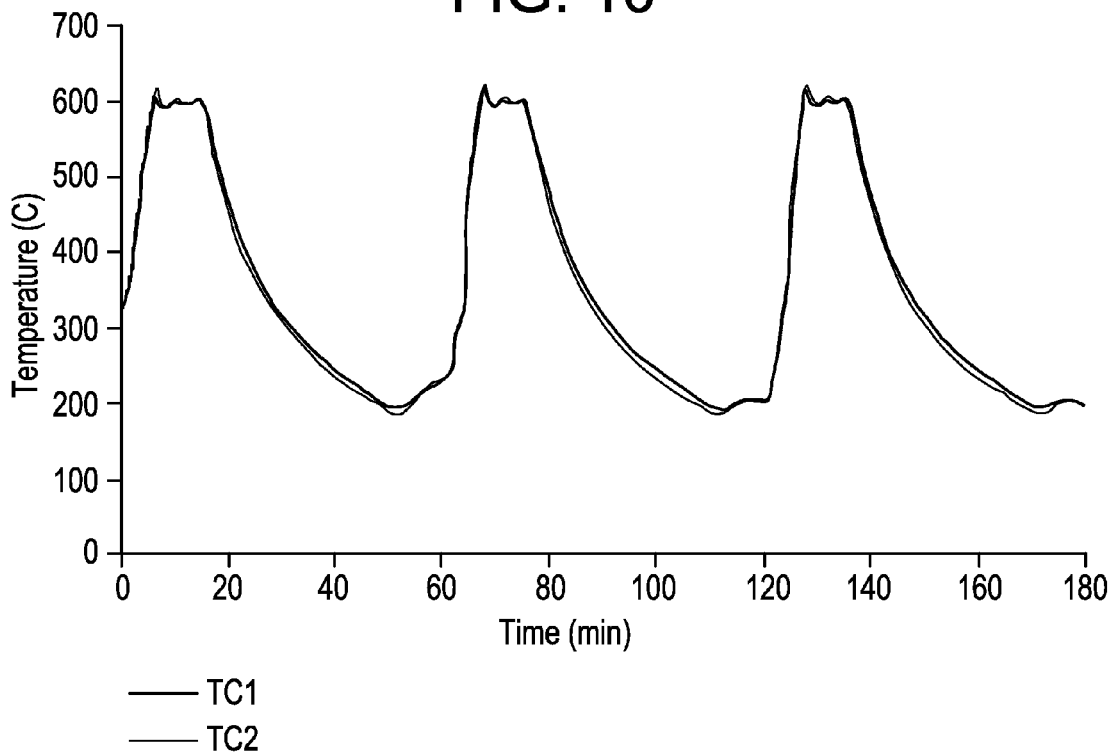
FIG. 10 is a graph of temperature vs. time illustrating the thermal cycling of the batch assembly as exemplified in an embodiment of the invention.

In this experiment to evaluate the performance of a batch assembly during thermal cycling, two half-cylindrical sections were put together forming a cylindrical heater for use in the assembly. Conforming stainless steel reflectors were affixed to the back of the heater sections using alumina spacers leaving a 10 mm gap. The assembly was affixed to a support structure then subjected to a ramp test of 158 thermal cycles from 200 to 600° C. This is as typically experienced in a batch heating assembly to heat a quartz chamber in a wafer substrate processing system. For each cycle, the heater was ramped up to 600° C., held at 600° C. for 7 min, allowed to cool down to 200° C., held at 200° C. for 10 min. As illustrated in FIG. 10, the assembly demonstrated a ramp rate to 600° C. in excess of 50° C./min.

While the invention has been described with reference to a preferred embodiment, those skilled in the art will understand that various changes may be made and equivalents may be substituted for elements thereof without departing from the scope of the invention. In addition, many modifications may be made to adapt a particular situation or material to the teachings of the invention without departing from the essential scope thereof.

All citations referred herein are expressly incorporated herein by reference.

What is claimed is:

1. A batch treatment apparatus for use in heating a plurality of wafer substrates to a process temperature of 300-800° C., comprising:

a chamber having an interior for placement of a wafer boat containing a plurality of shelves for supporting the wafer substrates;

at least a heater located outside the chamber, the heater having an interior side and an exterior side, with the interior side facing the chamber and transmitting heat energy to the chamber for heating the wafers contained therein;

at least one heat shield layer disposed on the exterior side of the heater, and at least a metalized insulating layer disposed outside of the heat shield layer;

wherein the heater having at least one resistive heating element patterned in a plurality of circuits defining at least one zone for independent controlled heating of said at least zone, at least a portion of the patterned resistance heating element is coated with at least a layer comprising at least one of a nitride, carbide, carbonitride or oxynitride of elements selected from a group consisting of B, Al, Si, Ga, refractory hard metals, transition metals, and rare earth metals, or complexes and/or combinations thereof; a high thermal stability zirconium phosphate having an NZP structure of $NaZr_2(PO_4)_3$; a glass-ceramic composition containing at least one element selected from the group consisting of elements of the group 2a, group 3a and group 4a; a BaO—Al$_2$O$_3$—B$_2$O$_3$—SiO$_2$ glass; and a mixture of SiO$_2$ and an oxide of Y, Sc, La, Ce, Gd, Eu, or Dy;

wherein the coating layer is disposed on patterned resistive heating element by at least one of expanding thermal plasma (ETP), chemical vapor deposition (CVD), plasma enhanced chemical vapor deposition, ion plasma deposition, metal organic chemical vapor deposition, metal organic vapor phase epitaxy, sputtering, electron beam and plasma spray;

and wherein the chamber is heated to the process temperature at a ramp rate of at least 40° C./minute.

2. The batch treatment apparatus of claim 1, wherein the patterned resistive heating element comprises graphite.

3. The batch treatment apparatus of claim 2, wherein the patterned graphite resistive heating element is coated with a dielectric insulating layer comprising one of pyrolytic boron nitride and aluminum nitride.

4. The batch treatment apparatus of claim 1, wherein the heat shield comprises a heat reflective surface comprising at least a material selected from the group consisting of glass, ceramics, and combinations thereof.

5. The batch treatment apparatus of claim 1, wherein the heat shield comprises heat reflective surface comprising at least a material selected from the group consisting of aluminum, nickel, iron, tungsten, tantalum, molybdenum, and alloys thereof.

6. The batch treatment apparatus of claim 1, wherein there is a non-contacting gap between the heater and the heat shield.

7. The batch treatment apparatus of claim 1, further comprising a shaft extending through a base plate operative to support the wafer boat, moving the plurality of wafers in a vertical orientation for loading/unloading of the wafers.

8. The batch treatment apparatus of claim 1, wherein the heater is in a shape conforming to the shape of the chamber.

9. The batch treatment apparatus of claim 1, wherein the heater comprises a plurality of heater sections, wherein each heater section comprises at least one resistance heating element having at least one resistive heating element patterned in a plurality of circuits defining at least one zone for independent controlled heating of said at least zone, at least a portion of the heater section is coated with at least a layer comprising at least one of a nitride, carbide, carbonitride or oxynitride of elements selected from a group consisting of B, Al, Si, Ga, refractory hard metals, transition metals, and rare earth metals, or complexes and/or combinations thereof; a high thermal stability zirconium phosphate having an NZP structure of NaZr$_2$ (PO$_4$)$_3$; a glass-ceramic composition containing at least one element selected from the group consisting of elements of the group 2a, group 3a and group 4a; a BaO—Al$_2$O$_3$—B$_2$O$_3$—SiO$_2$ glass; and a mixture of SiO$_2$ and an oxide of Y, Sc, La, Ce, Gd, Eu, or Dy.

10. The batch treatment apparatus of claim 1, wherein the heater has a cross-sectional shape selected from one of: a cylinder, a rectangle, a square, and a polygon.

11. The batch treatment apparatus of claim 1, wherein the heater is one of a plate, a cylinder, a cylindrical section, a half-cylindrical section, a polygonal section, a spherical section, a disk, and a platen.

12. The batch treatment apparatus of claim 1, wherein the coating layer is disposed on the patterned resistive heating element via a chemical vapor deposition process.

13. The batch treatment apparatus of claim 1, wherein the heater having at least one resistance heating element is patterned in a plurality of circuits defining a plurality of heating zones and wherein each zone is independently controlled.

14. The batch treatment apparatus of claim 1, comprising a plurality of heaters that are interconnected in series or in parallel defining a plurality of heating zones.

15. The batch treatment apparatus of claim 1, wherein the heater has a ramp rate of at least 60° C./min in a temperature range of 300-800° C.

16. The batch treatment apparatus of claim 1, wherein the heater has a ramp rate of at least 80° C./min in a temperature range of 300-800° C.

17. The batch treatment apparatus of claim 1, wherein the heater has a ramp rate of at least 100° C./min in a temperature range of 300-800° C.

18. The batch treatment apparatus of claim 1, wherein the heat reflective surface comprises at least a material selected from the group consisting of glass, ceramics, and combinations thereof, and wherein the heat reflective surface is further coated with at least a material selected from the group of aluminum, nickel, -iron, tungsten, tantalum, molybdenum and combinations thereof.

19. A batch treatment apparatus for use in heating a plurality of wafer substrates to a process temperature of 300-800° C., comprising:

a chamber having an interior for placement of a wafer boat containing a plurality of shelves for supporting the wafer substrates;

a plurality of heaters located outside the chamber, each heater having an interior side and an exterior side, with the interior side facing the chamber and transmitting heat energy to the chamber for heating the wafers contained therein;

a plurality of heat shield layers disposed on the exterior side of the heaters, and at least a plurality of metalized insulating layer disposed outside of the heat shield layers;

wherein each heater having at least one resistive heating element patterned in a plurality of circuits defining at least one zone for independent controlled heating of said at least zone, at least a portion of the patterned resistance heating element is coated with at least a layer comprising at least one of a nitride, carbide, carbonitride or oxynitride of elements selected from a group consisting of B, Al, Si, Ga, refractory hard metals, transition metals, and rare earth metals, or complexes and/or combinations thereof; a high thermal stability zirconium phosphate having an NZP structure of NaZr$_2$ (PO$_4$)$_3$; a glass-ceramic composition containing at least one element selected from the group consisting of elements of the group 2a, group 3a and group 4a; a BaO—Al$_2$O$_3$—B$_2$O$_3$—SiO$_2$ glass; and a mixture of SiO$_2$ and an oxide of Y, Sc, La, Ce, Gd, Eu, or Dy;

wherein the coating layer is disposed on patterned resistive heating element by at least one of expanding thermal plasma (ETP), chemical vapor deposition (CVD), plasma enhanced chemical vapor deposition, ion plasma deposition, metal organic chemical vapor deposition, metal organic vapor phase epitaxy, sputtering, electron beam and plasma spray;

and wherein the chamber is heated to the process temperature at a ramp rate of at least 5° C./min;

and wherein the heaters are interconnected in series or in parallel.

20. The batch treatment apparatus of claim 1, wherein the wafer substrates are heated to process temperature at a ramp rate of at least 100° C./minute.

* * * * *